(12) United States Patent
Bachman et al.

(10) Patent No.: US 9,054,064 B2
(45) Date of Patent: Jun. 9, 2015

(54) STACKED INTERCONNECT HEAT SINK

(71) Applicant: LSI Corporation, Milpitas, CA (US)

(72) Inventors: Mark A Bachman, Sinking Spring, PA (US); John W Osenbach, Kutztown, PA (US); Sailesh M Merchant, Macungie, PA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/921,707

(22) Filed: Jun. 19, 2013

(65) Prior Publication Data

US 2013/0280864 A1 Oct. 24, 2013

Related U.S. Application Data

(62) Division of application No. 12/840,016, filed on Jul. 20, 2010, now Pat. No. 8,492,911.

(51) Int. Cl.
*H01L 23/28* (2006.01)
*H01L 23/34* (2006.01)
*H01L 23/367* (2006.01)
*H01L 25/065* (2006.01)
*H05K 1/02* (2006.01)
*H01L 23/31* (2006.01)
*H01L 23/00* (2006.01)

(52) U.S. Cl.
CPC .............. *H01L 23/34* (2013.01); *H01L 23/3128* (2013.01); *H01L 23/3677* (2013.01); *H01L 24/16* (2013.01); *H01L 25/0657* (2013.01); H01L 2224/13025 (2013.01); H01L 2224/73253 (2013.01); H01L 2225/06517 (2013.01); H01L 2225/06572 (2013.01); H01L 2225/06589 (2013.01); H01L 2924/01025 (2013.01); H01L 2924/01046 (2013.01); H01L 2924/01078 (2013.01); H01L 2924/01079 (2013.01); H01L 2924/14 (2013.01); H01L 2924/15311 (2013.01); H01L 2224/16225 (2013.01); H01L 2924/01019 (2013.01); *H05K 1/0201* (2013.01); H01L 2924/10253 (2013.01); H01L 2224/05025 (2013.01)

(58) Field of Classification Search
None
See application file for complete search history.

(56) References Cited

U.S. PATENT DOCUMENTS

| 6,020,637 | A | 2/2000 | Karnezos |
| 7,317,256 | B2 | 1/2008 | Williams et al. |
| 7,592,697 | B2 | 9/2009 | Arana et al. |
| 7,608,923 | B2 | 10/2009 | Hsu |
| 8,853,854 | B2 * | 10/2014 | Lee ............................... 257/737 |
| 2008/0150088 | A1 | 6/2008 | Reed et al. |
| 2008/0237844 | A1 | 10/2008 | Aleksov et al. |
| 2009/0201643 | A1 | 8/2009 | Shi et al. |

(Continued)

OTHER PUBLICATIONS

Kim, Bioh; "Through-Silicon-Via Copper Deposition for Vertical Chip Integration (Abstract)"; Materials Research Society; www.mrs.org; Jan. 20, 2010; pp. 1.

(Continued)

*Primary Examiner* — Jack Chen
(74) *Attorney, Agent, or Firm* — Suiter Swantz pc llo

(57) ABSTRACT

A heat spreader that is configured to be attached to an integrated circuit substrate. The heat spreader includes a thermally conductive core and a heat spreader via that passes through the thermally conductive core. A connection point of the thermally conductive core is configured to form a solder connection to an integrated circuit substrate plug.

7 Claims, 11 Drawing Sheets

(56) References Cited

U.S. PATENT DOCUMENTS

2009/0243074 A1 10/2009 Ramiah et al.
2009/0294954 A1 12/2009 Bakir et al.
2009/0317947 A1 12/2009 Kwon et al.

OTHER PUBLICATIONS

Vardaman, Jan; et al.; "3-D Through-Silicon Vias Become a Reality"; IEEE Xplore (www.ieeexplore.ieee.org); Jan. 20, 2010; pp. 3.

Sung, Baekyoung; "Thermal Enhancement of Stacked Dies using Thermal Vias"; Presented to the Faculty of the Graduate School of the University of Texas at Arlington (Thesis); Dec. 2006; 59 pages.

Zhang, C., et al.; Thermo-Structural Model of Stacked Field-programmable Gate Arrays (FPGAs) with Throughsilicon Vias (TSVs); Electronics Letters, vol. 45, Issue 24; Nov. 18, 2009; 9 Pages.

Khan, N, et al.; "Development of 3D stack package using silicon interposer for high power application (Abstract)"; IEEE Xplore Digital Library—Electronic Components and Technology Conference, 2006, Proceedings, 56th; 1 Page.

* cited by examiner

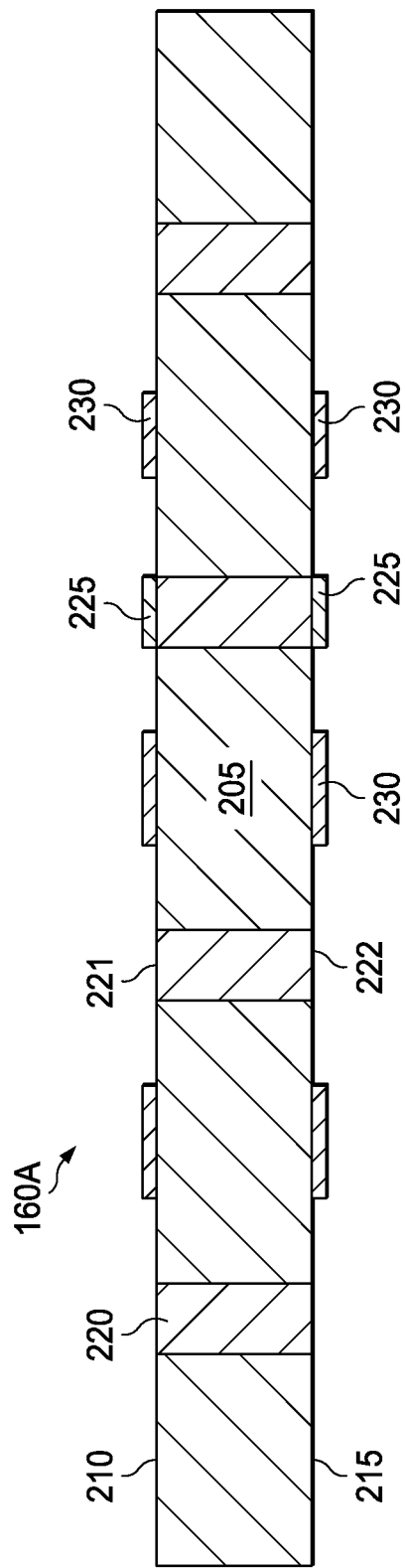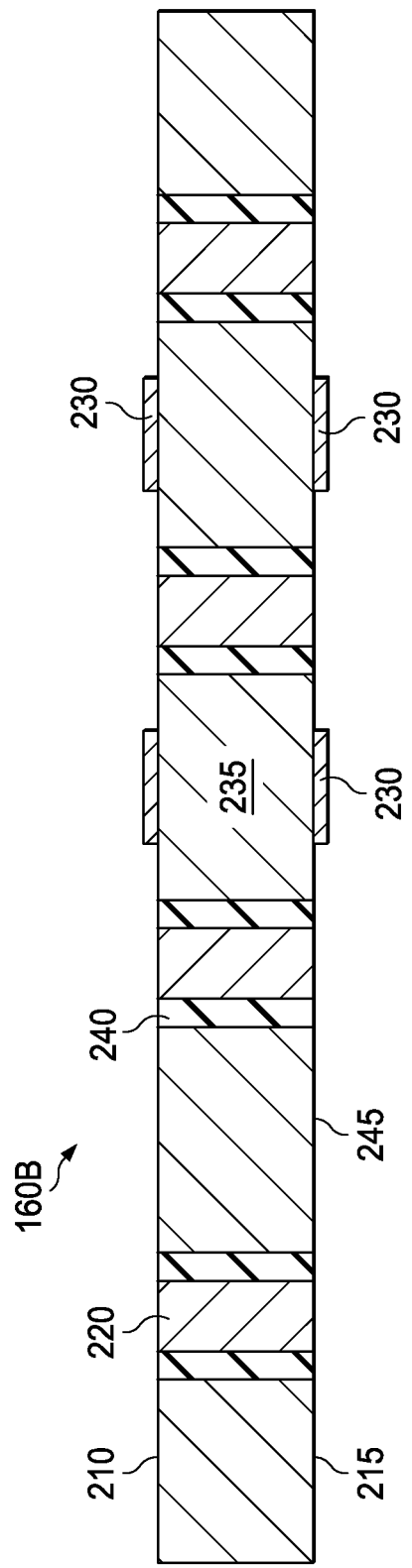

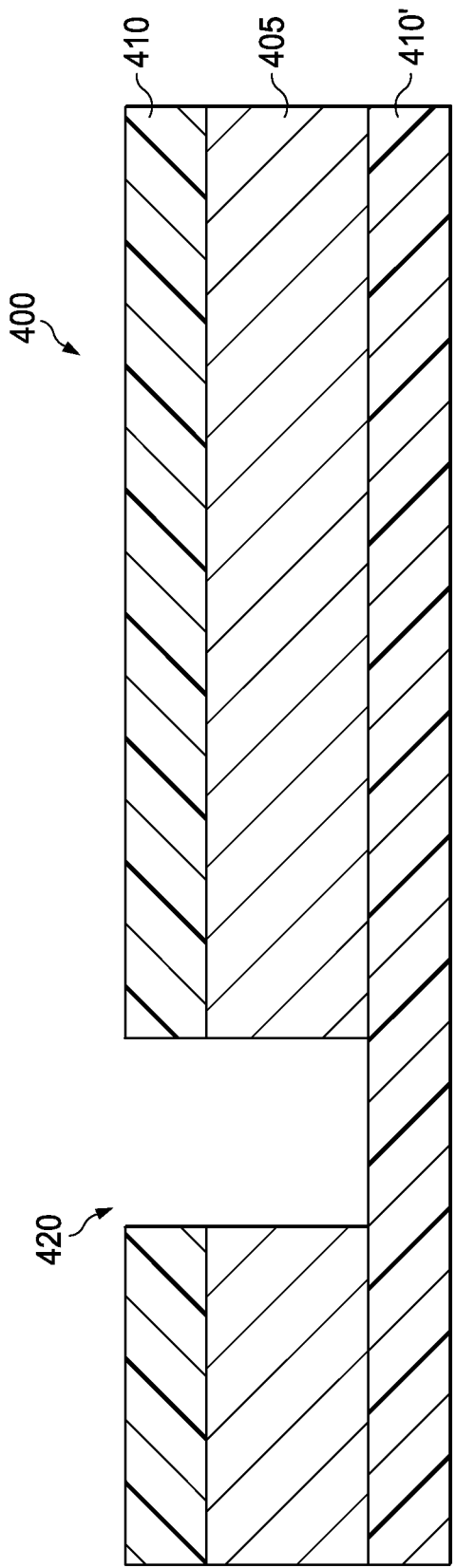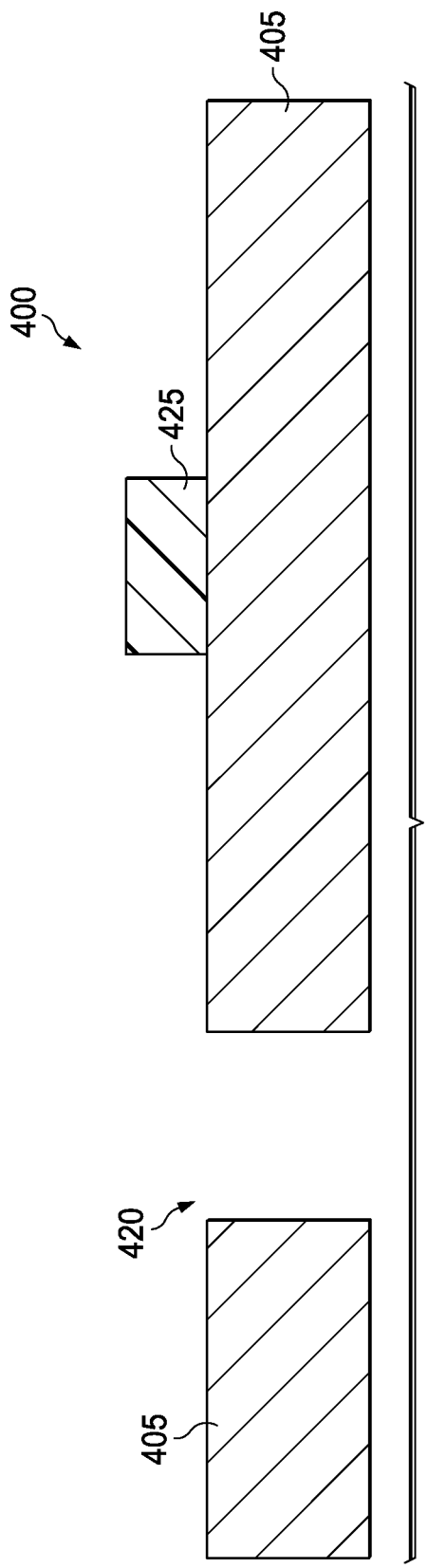

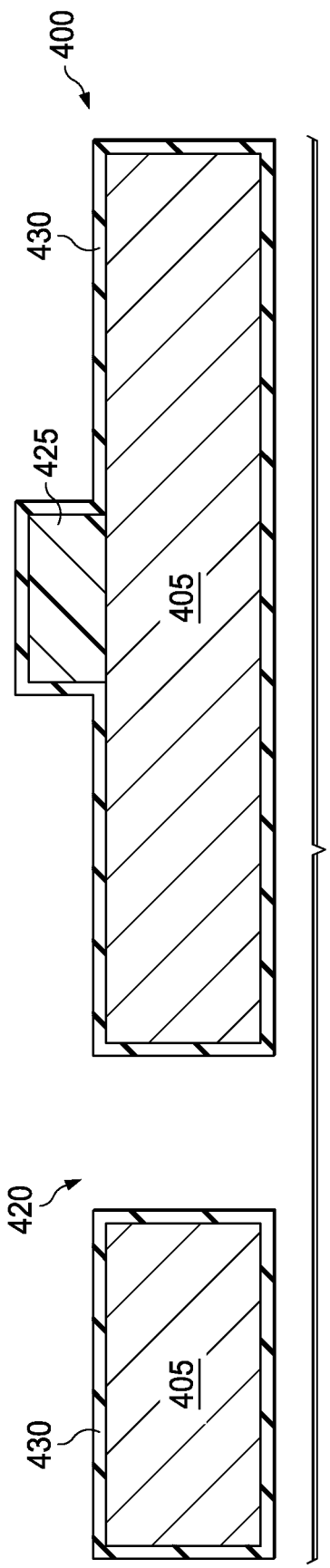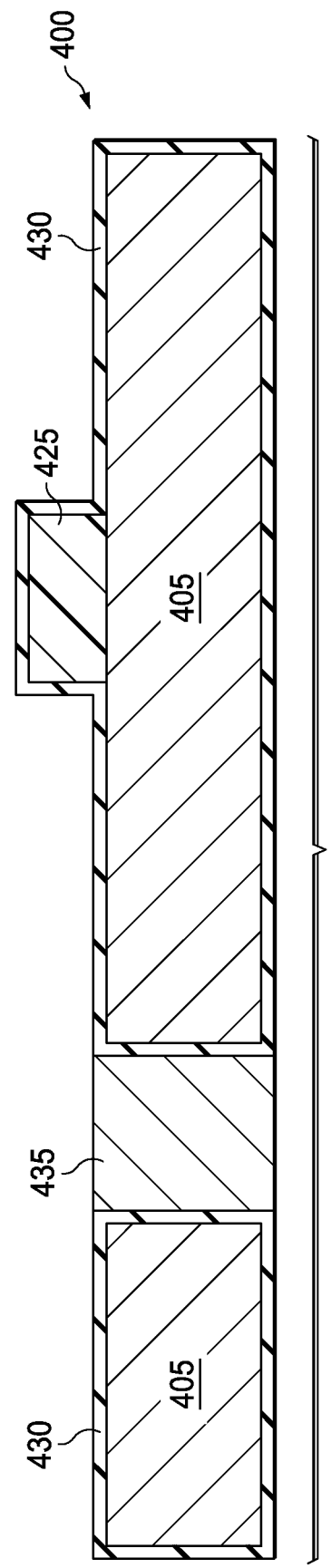

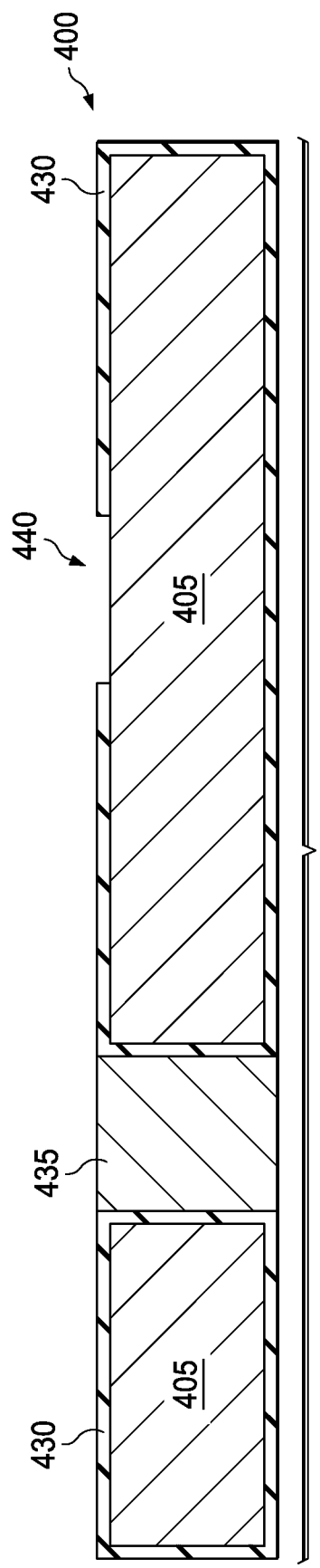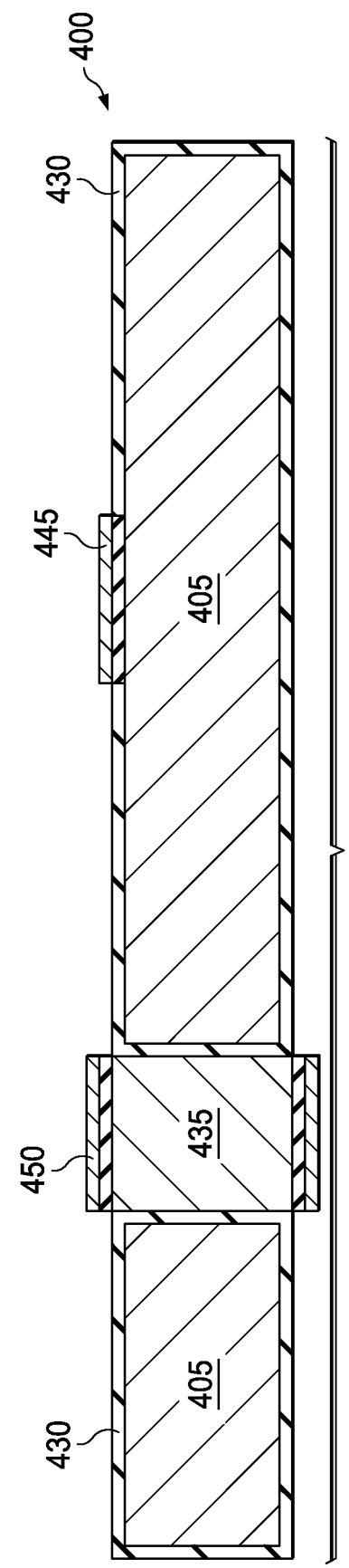

STACKED INTERCONNECT HEAT SINK

CROSS-REFERENCE TO RELATED APPLICATIONS

This Application is a Divisional of U.S. application Ser. No. 12/840,016 filed on Jul. 20, 2010, to Mark A. Bachman, et al., entitled "STACKED INTERCONNECT HEAT SINK," currently allowed; commonly assigned with the present invention and incorporated herein by reference.

TECHNICAL FIELD

This application is directed, in general, to an electronic device, and more specifically, to heat extraction therefrom.

BACKGROUND

Heat extraction from electronic devices remains an essential aspect of electronic system design. The increasing density of integration of such devices has resulted in steadily increasing power density, e.g. a quantity of power dissipated per unit area of the electronic device. Shrinking dimensions of interconnect traces (metal lines) leads to greater sensitivity to high temperature due to effects such as temperature-activated electromigration. This combination of factors has resulted in increasing attention to heat-related system design issues on the part of electronic device and system manufacturers. However, such attention has not been sufficient to mitigate heat-related issues in all design contexts.

SUMMARY

One aspect provides a heat spreader that is configured to be attached to an integrated circuit substrate. The heat spreader includes a thermally conductive core and a heat spreader via that passes through the thermally conductive core. A connection point of the thermally conductive core is configured to form a solder connection to an integrated circuit substrate plug.

Yet another aspect provides a method of forming an electronic device. The method includes providing an integrated circuit that has a substrate. An active via is located within the substrate. The active via is connected to a corresponding heat spreader via that passes through a thermally conductive core of a heat spreader.

BRIEF DESCRIPTION

Reference is now made to the following descriptions taken in conjunction with the accompanying drawings, in which:

FIGS. 2A-2D illustrate various embodiments of a heat spreader of the disclosure, e.g. the heat spreader 160 of FIG. 1;

FIGS. 4A-4I illustrates a method of forming a heat spreader of the disclosure, e.g. the heat spreader 160 of FIG. 1.

DETAILED DESCRIPTION

One area of heat extraction receiving increasing attention is three-dimensional (3D) packaging. In such applications, two or more integrated circuits (ICs) may be integrated in a vertical device stack and placed in a common package. Herein a device stack is an assembly of at least first and second electronic devices, e.g., ICs, in which the second IC is located over a package substrate, and the first IC is located between the second IC and the package substrate. Such a device may include, e.g., flip chip, ball-grid array and through-silicon via processes.

While providing a space-efficient means of integrating electronic devices residing on different die, 3D packaging may be complicated in some cases by the need to extract dissipated heat from the vertical stack to avoid exceeding a temperature above which operation or reliability of the packaged device may be compromised. Few, if any, solutions are provided by conventional process techniques that provide for the power dissipation required by system designers contemplating increasingly aggressive packaging solutions.

The present disclosure benefits from the recognition that detrimental effects related to heat dissipation in an integrated circuit stack may be mitigated by introducing a novel heat spreader to the stack to extract heat therefrom. A novel electronic device architecture includes the heat spreader configured between two integrated circuits in an IC stack. Via paths through the heat spreader allow signals to pass between the integrated circuits. The heat spreader may shunt heat from the interior of the stack to any of many possible heat-dissipating paths such as a device package, thermo-electric cooler, heat sink or system substrate (printed circuit board), thereby reducing the operating temperature of the stack.

Figure 1:
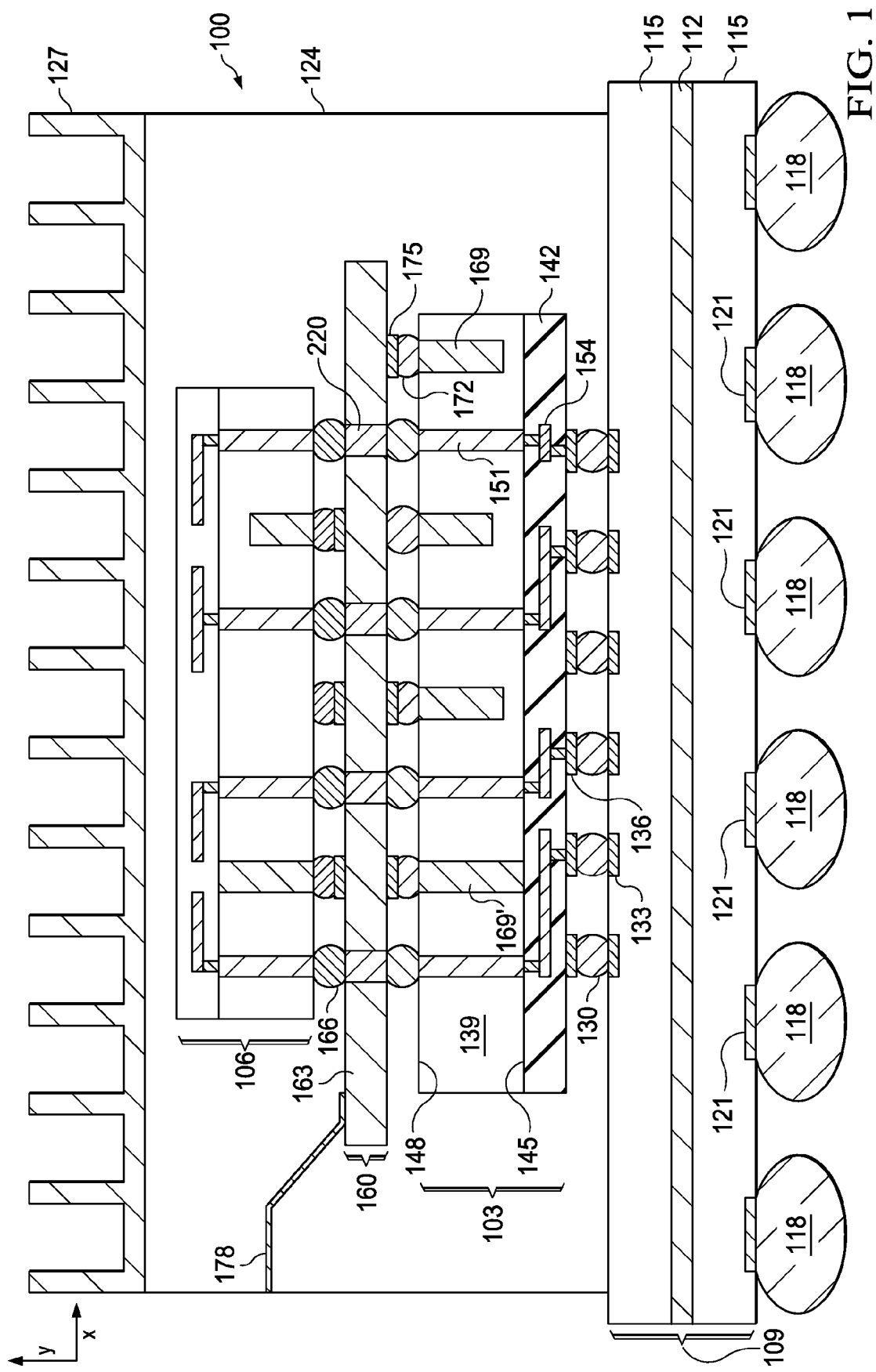
FIG. 1 illustrates an electronic device of the disclosure that includes a heat spreader located between two integrated circuits in a 3-D device stack.

Turning to FIG. 1, illustrated is an electronic device 100 of the disclosure that includes a first IC 103 and a second IC 106 in a vertical stacked configuration over a substrate 109. For the purposes of discussion, "vertical" is in a direction parallel to the y-axis of FIG. 1, as marked, e.g. about normal to the plane of the substrate 109. No orientation to references outside the device 100 is necessarily implied by the terms vertical and horizontal. The device 100 is illustrative of various embodiments within the scope of the disclosure, and is not intended to limit the scope of the disclosure. Those skilled in the pertinent art will recognize that alternate embodiments may include variants on the device 100, such as, without limitation, a greater number of integrated circuits, different package types, including plastic and ceramic, and packages with leads.

The substrate 109, illustratively includes a core 112 and signal routing layers 115. Embodiments within the scope of the disclosure are not limited to any particular type of substrate 109. The signal routing layers 115 may include multiple signal routing sublayers. Illustratively, solder balls 118 that may be part of a conventional ball-grid-array, are attached to ball pads 121. The solder balls 118 may be used to attach the device 100 to an electronic assembly such as a circuit board (not shown). The substrate 109 and an overlying package body 124 thereover form a package that may be any conventional or future-developed type, such as a ball-grid-array (BGA), a cavity-type BGA, a multi-chip module (MCM), a plastic leaded chip carrier (PLCC) and a ceramic leaded chip carrier. Optionally a heat sink 127 may be thermally connected to the package body 124. While illustrated as a finned heat sink, the heat sink 127, if used, may be of any type, including an active device such as a thermo-electric module.

The IC 103 is illustratively located over the substrate 109 in a "flip-chip" configuration. Conventional solder balls 130 located between the IC 103 and the substrate 109 form an electrical and mechanical connection therebetween via solder pads 133 located on the substrate 109 and solder pads 136 located on the IC 103. The IC 103 includes a substrate 139 and an interconnect level 142. The substrate 139 may include, e.g. a semiconductor substrate such as a Si die cut from a production wafer. The interconnect level 142 may include one or more metal layers and one or more dielectric layers arranged to provide connections between electronic components such as transistors on the substrate 139. The substrate 139 has a front surface 145 that forms an interface with the interconnect level 142, and an opposing backside surface 148. Signals are routed from the solder balls 130 to a conventional active via 151 by way of a conventional illustrative interconnect line 154.

The active via 151 is a via that is configured to conduct power, ground or an active signal. An active signal is a signal that conveys analog and/or digital information and is output by an active circuit of an integrated circuit. An active circuit is a circuit that includes logic gates and/or analog circuits and operates to modify a signal to convey information.

A heat spreader 160 is located between the IC 103 and the IC 106. The heat spreader 160 includes a thermally conductive core 163. Herein and in the claims, thermally conductive means having a thermal conductivity of at least about 10 W/m·K. In various embodiments the heat spreader 160 is configured to remove heat from the stacked IC 103 and IC 106, thereby reducing an operating temperature of one or both ICs 103, 106. The thermally conductive core 163 may be, e.g., metallic, ceramic or composite. If metallic, the thermal conductivity is preferably at least about 100 W/m·k, more preferably at least about 200 W/m·K, and most preferably at least about 400 W/m·K. If ceramic or composite, the thermal conductivity is preferably at least about 10 W/m·K, more preferably at least about 20 W/km, and most preferably at least about 100 W/m·K.

Figure 2C:
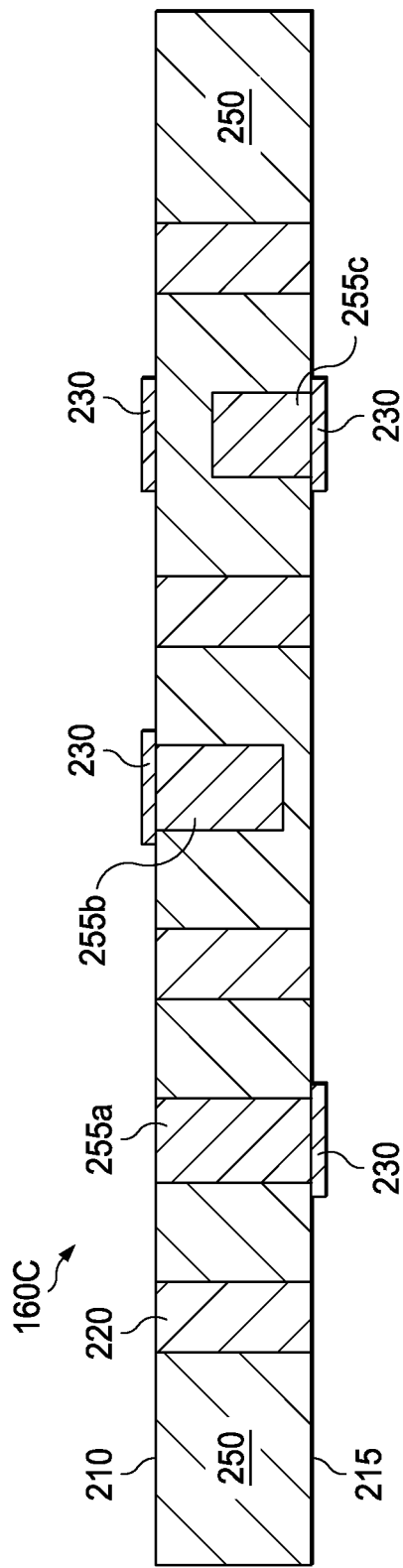

FIGS. 2A-2D illustrate various embodiments of the heat spreader 160. The illustrated embodiments are not exclusive of other embodiments otherwise within the scope of the disclosure. FIG. 2A illustrates an embodiment in which a heat spreader 160A includes an electrically insulating, or dielectric, core 205. In one aspect the core 205 is thermally conductive. Example materials that are electrically insulating and thermally conducting include, e.g. some ceramic and some composite materials, and some glasses. Herein ceramic materials include various inorganic compounds commonly described as ceramic, such as $Al_2O_3$, BN, and SiC, as well as diamond-like carbon (DLC). Composite materials may be, e.g. an organic or silicone-based resin or ceramic matrix with filler particles that confer greater thermal conductivity than the resin or matrix by itself. Illustrative examples of composite materials that may be used for the thermally conductive core 163 include AlSiC metal matrix composite with a thermal conductivity of at least about 200 W/m·K, manufactured by Alpha Materials Inc., St. Paul, Minn., USA, and plastic resin composite with a thermal conductivity of about 10 W/m·K, manufactured by Cool Polymers, Inc, Warwick, R.I., USA.

In one embodiment, the heat spreader 160 is a microchannel substrate. Those of skill in the pertinent art will appreciate that a microchannel substrate may be formed using conventional methods. A coolant such as water or a refrigerant may circulate through the microchannels. Heat from the first IC 103 and/or the second IC 106 may be transferred to the coolant, thereby increasing the rate of heat transfer from the device 100. The coolant may then circulate through an external heat exchanger to dump the waste heat. The coolant may circulate in a closed loop or open loop.

With continuing reference to FIG. 2A, the thermally conductive core 205 has a first major surface 210 and an opposing second major surface 215. A heat spreader via 220 passes through the thermally conductive core 205. By "passes through", it is meant that the heat spreader via 220 presents a via surface 221 at the first major surface 210 and a via surface 222 at the second major surface 215. In one aspect the heat spreader via 220 is electrically conducting, thereby conducting the signal carried by the active via 151 through the thermally conductive core 163. The surfaces 221, 222 may form a bond to a solder connection, e.g. a solder ball. Optionally an interface layer 225 may be located on one or both surfaces 221, 222. The interface layer 225 may include a combination of one or more metal layers conventionally used for solder connection metallization, such as Pd, Ni, Pt or Au.

One or more connection points 230 may be located on the core 205. The connection points 230 provide a means to form a solder connection between the IC 103 and/or the IC 106 and the core 205, thereby forming a thermal path to the core 205. The connection points 230 are illustrated as, e.g. solder pads. Each connection point 230 may include one or more compound and/or elemental layers as needed to provide a mechanical and thermal connection to the core 205. Such layers may include, without limitation, metallic layers such as Pd, Ni, Pt and Au, and compound layers such as TiN, TaN. Optionally, to enhance adhesion of the connection points 230, the surfaces 210, 215 may be treated with a plasma process to clean, roughen or chemically activate the surfaces 210, 215.

FIG. 2B illustrates an embodiment of a heat spreader 160B. In this embodiment, the heat spreader 160B includes a core 235 that is formed of an electrically conductive material such as a metal. As used herein in the context of the core 235, electrically conductive means that the electrical conductivity $\sigma$ of the thermally conductive core 163 is high enough that signals conducted through multiple heat spreader vias 220 would not be adequately isolated to accurately convey information between the IC 103 and the IC 106. In some cases, e.g., $\sigma \gtrsim 5$ S·m$^{-1}$ is considered electrically conductive. The core 235 is not limited to any particular metal. However, metals selected from or including Ni, Brass, Zi, Al, Au, Cu or Ag may be advantageously employed, as these have a thermal conductivity of at least 200 W/m·K. In some cases, a copper core 235 may be preferred, as copper has a thermal conductivity greater than 400 W/m·K.

An insulating sleeve 240 may be located between the heat spreader via 220 and the core 235. The insulating sleeve 240 may be any suitable insulator, such as a ceramic or a polymer. The insulating sleeve 240 may be preformed and inserted into an opening formed in the core 205, or may be formed on a sidewall of such an opening. When the insulating sleeve 240 is preformed, the heat spreader via 220 may be located within the insulating sleeve 240 before or after the insulating sleeve 240 is located within the core 235. In one illustrative example, the insulating sleeve 240 may first be formed on a wire, the coated wire being then inserted into a hole formed in the core 235, and then trimmed flush with the surfaces 210, 215 to form the heat spreader via 220. In another illustrative example, an insulating material may be deposited within the opening by a conformal process such as chemical vapor deposition (CVD) or surface polymerization (e.g. the parylene family of materials) to form the insulating sleeve 240. The heat spreader via 220 may then be formed within the insulated hole by an electroplating or electroless deposition process.

Optionally, the connection points 230, e.g. solder pads, may be formed on the electrically conductive core 235. When solder pads are used as the connection points 230, a solder connection to the heat spreader 160B may be improved by promoting wetting of the solder to the solder pad by selecting a compatible noble top metal layer such as Au or Pd. Such a layer may provide a surface that does not readily form an oxide to enhance a connection to a solder ball. In some cases no solder pad is needed for the connection point 230, such as when the core 235 presents a solderable surface. In such cases a connection point 245 may be any desired location on the first major surface 210 or the second major surface 215.

FIG. 2C illustrates an embodiment of a heat spreader 160C having a core 250. In this embodiment, heat spreader plugs 255a-255c, collectively referred to as heat spreader plugs 255, are located at least partially within the core 250, which may be electrically insulating or conducting. The heat spreader plugs 255 may thereby increase the flow of heat from the ICs 103/106 to the core 250. Three examples of the heat spreader plugs 255 are illustrated without limitation. The heat spreader plug 255a extends completely through the core 250. The heat spreader plug 255b extends partially through the core 250, and has a surface available to form a solder connection on the second major surface 215 side of the core 250. The heat spreader plug 255c extends partially through the core 250, and has a surface available to form a solder connection on the first major surface 210 side of the core 250. Optionally, a connection point 230 may be formed on the exposed surface of any of the heat spreader plugs 255a, 255b, 255c.

Figure 2D:
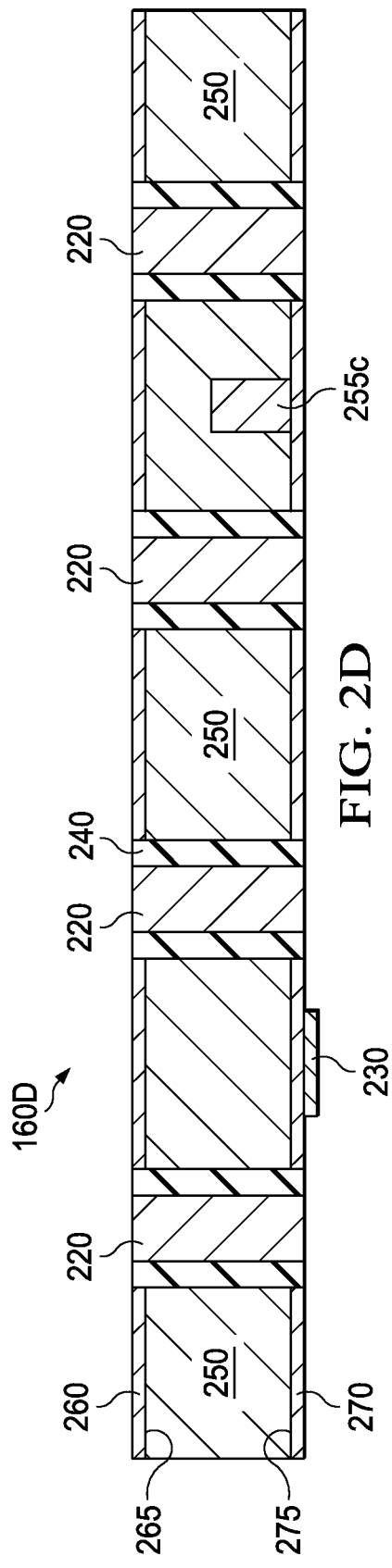

FIG. 2D illustrates embodiment of a heat spreader 160D. In this embodiment the core 250, that may be either electrically conducting or insulating, has a metal layer 260 on a first major surface 265 and a metal layer 270 on a second major surface 275. The heat spreader 160D may include the heat spreader via 220 and the insulating sleeve 240 as previously described. Optionally, one or more connection points 230 and/or one or more heat spreader plugs 255 of any of the described embodiments may be included. The metal layers 260, 270 may be selected to reduce oxidation and/or promote solderability. For example, the metal layers 260, 270 may include one or more layers of Ni, Pd, Pt or Au, such as Ni, Ni/Pd, Ni/Pd/Au, or other combinations of finish layers known to provide a solderable surface. Such finish layers are well known to those skilled in the pertinent art, and may be formed using conventional processes such as electroplating or physical vapor deposition in combination with lithography and etch, or physical masking.

Returning to FIG. 1, the heat spreader via 220 conducts the signal between the IC 103 and the IC 106 by way of a conventional solder ball 166. The solder ball 166 forms an electrical and mechanical connection between the IC 106 and the heat spreader vias 220. In some embodiments a substrate plug 169 is located within the IC 103 or the IC 106. Focusing on the IC 103 for convenience of discussion, the substrate plug 169 is located within the substrate 139. The substrate plug 169 may be connected to a solder ball 172, which in the illustrated embodiment is in turn connected to a connection point 175 located on the thermally conductive core 163. In some cases the connection point 175 includes the connection point 230. The substrate plug 169 and the solder ball 172 form a thermal path that may conduct heat from the substrate 139 to the heat spreader 160. The heat spreader 160 may transfer heat to the package body 124 by way of a metallic thermal shunt 178, or simply by virtue of providing a larger surface area to transfer heat to, e.g. a composite molded package in which the heat spreader 160 may be embedded.

The substrate plug 169 differs from a conventional through-substrate via in that the substrate plug 169 does not conduct any active electrical signal. However, the substrate plug 169 may provide a connection to a ground reference by way of the package body 124. A plurality of substrate plugs 169 may be simultaneously connected to the thermally conductive core 163 that is electrically conductive without risk of shorting active signals together. In some embodiments the substrate plug 169 intersects both the front surface 145 and the backside surface 148 of the substrate 139 as illustrated by a substrate plug 169'. In some embodiments, the substrate plug 169 intersects only the backside surface 148 of the substrate 139, as illustrated. This latter embodiment may be advantageous in situations in which design considerations make it preferable to utilize a greater percentage of the front surface 145 of the substrate 139 for active circuitry. The substrate plug 169 is not limited to any particular diameter, or any particular depth. The diameter may be chosen so that the process of forming the substrate plug 169 is the same as that used to form a via level of interconnects on the front side of the substrate 139. In some cases, the substrate 139 may be polished on the backside thereof prior to forming the device 100.

The heat spreader 160 is expected to provide an effective means to conduct heat from the device 100 during operation thereof. In a conventional IC stack the temperature of the IC 106 is expected to rise to a temperature that depends in part on the total power dissipation and thermal properties of the IC 103 and the IC 106. In particular, in conventional applications heat generated by the ICs 103, 106 predominantly conducted vertically (parallel to the y-axis), down to the solder balls 118 and to an underlying substrate, and to some degree up to the package body 124. However, various layers of the ICs 103, 106 and the substrate 109, such as dielectric layers, typically have a low thermal conductivity. The presence of such layers has the effect of thermally insulating the ICs 103, 106 from the surrounding environment, resulting in an operating temperature that may exceed a maximum desired operating temperature.

The heat spreader 160 provides a horizontal (parallel to the x-axis) thermal path to remove heat from the device 100. The thermal path provided by the heat spreader 160 does not include dielectric layers in a form that significantly hinders the flow of heat from the ICs 103, 106. Thus, the heat spreader 160 is expected to effectively conduct heat to the outside environment, desirably lowering the operating temperature of the device 100.

Figure 3A:
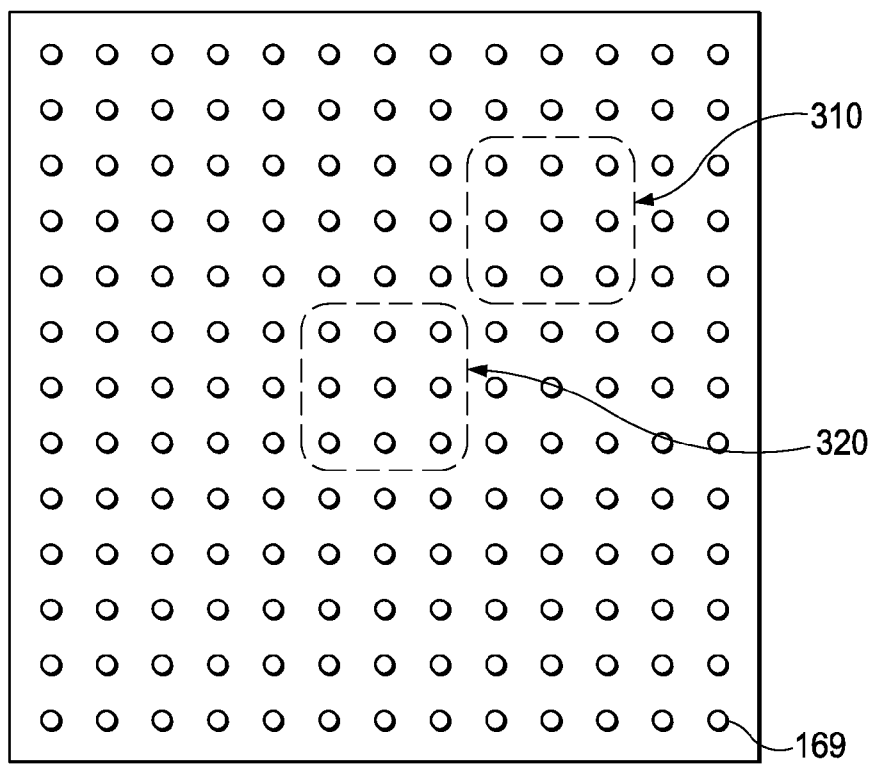
FIGS. 3A-3D illustrate various configurations of substrate plugs in an integrated circuit substrate for corresponding heat dissipation patterns of an integrated circuit.

Turning to FIGS. 3A-3D, illustrated are various configurations of substrate plugs 169, 169' in an integrated circuit substrate such as the substrate 139. The active vias 151 are omitted to focus on aspects of extracting heat from the substrate 139 for various cases. FIG. 3A illustrates an embodiment in which the substrate plugs 169 are located on a regular two-dimensional array. Such a configuration may be implemented simply, and is expected to conduct heat from the substrate 139 at a rate about linearly proportional to the rate at which heat is generated in a particular location of the substrate 139, at least when the heat flows in a linear regime of the conduction path. For example, if a region 310 dissipates one watt, and a region 320 dissipates two watts, heat is expected to flow via the substrate plugs 169 in the region 320 at a rate twice that of substrate plugs 169 in the region 310. However, the temperature rise in the region 320 is expected to be greater than in the region 310 due to the finite thermal conductivity of the substrate plugs 169.

Figure 3B:
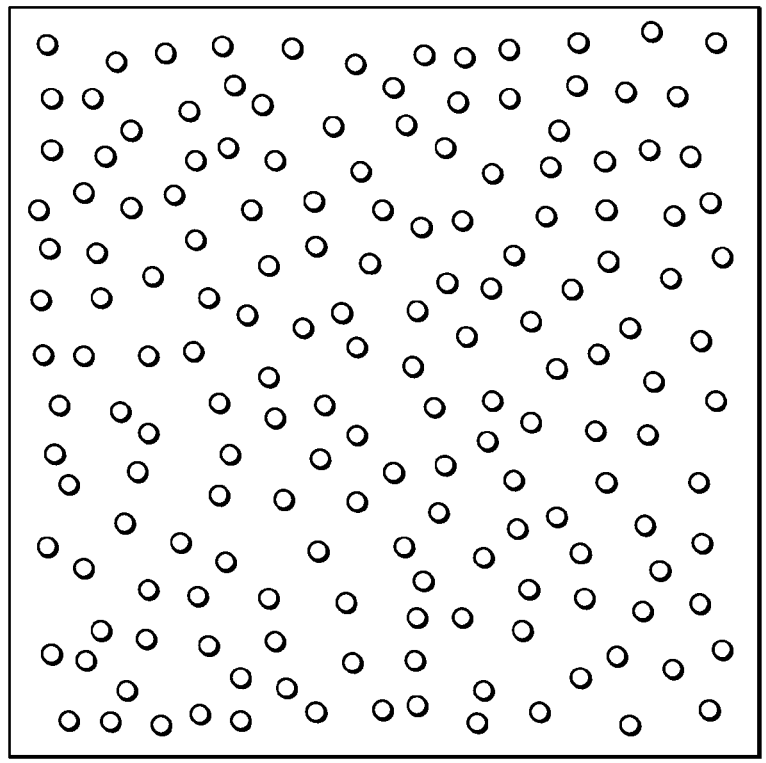

FIG. 3B illustrates an embodiment in which the substrate plugs are distributed in a pseudo-random manner related the availability of space on the substrate 139 that is not occupied by circuitry. Such a configuration may result, e.g. when the substrate plugs 169' extend to the active side of the substrate 139. The configuration of FIG. 3B is also expected to result in regions of higher and lower temperature on the substrate 139 during operation.

Figure 3C:
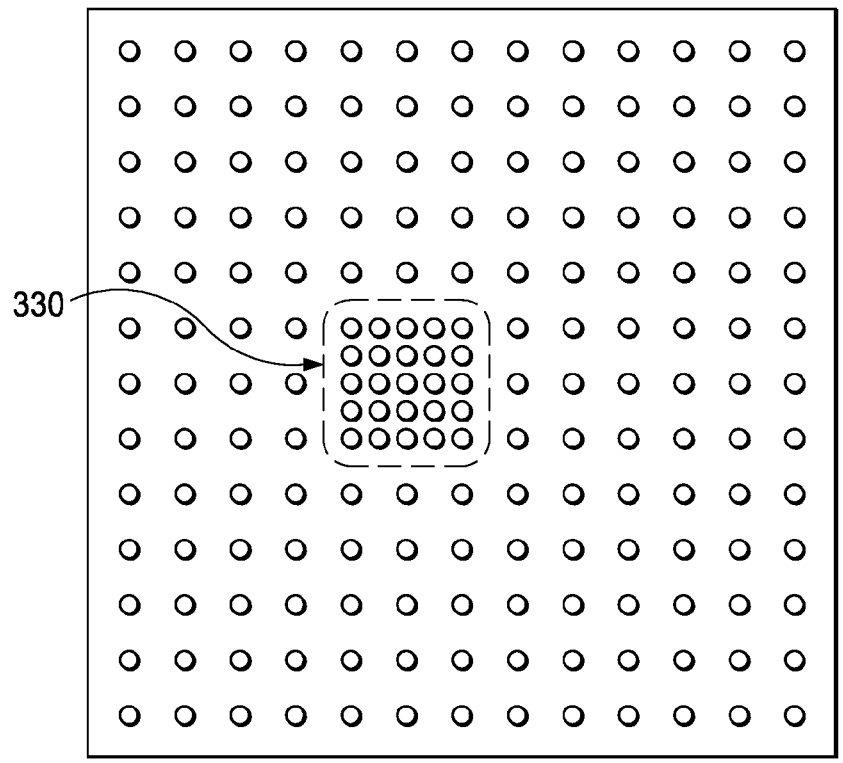

FIG. 3C illustrates an embodiment in which a greater concentration of substrate plugs 169 is placed in a region 330. The region 330 may be associated with a greater power density than portions of the substrate 139 outside the region 330. It is expected that placing a sufficient number of substrate plugs 169 within the region 330 will function to limit the temperature rise of the region 330 to less than would occur with the uniform density of the substrate plugs 169 shown in FIG. 3A. Thus, the temperature of operation of the substrate 139 may be made more uniform by appropriate placement of the substrate plugs 169.

Figure 3D:
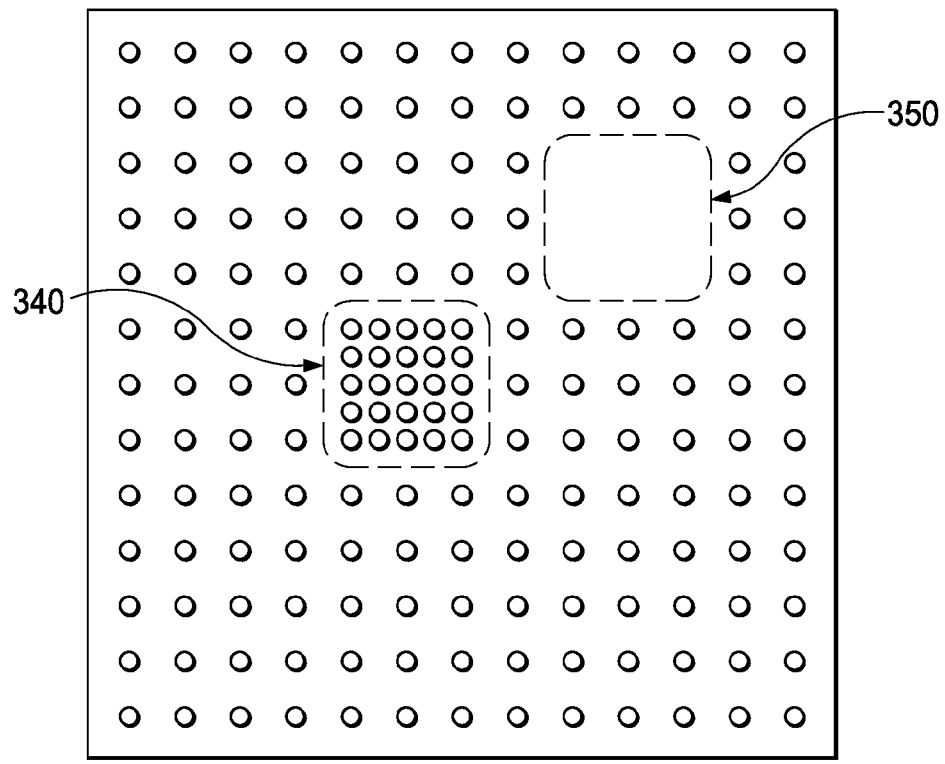

FIG. 3D illustrates an embodiment in which a greater concentration of substrate plugs 169 is placed in a region 340, and a lower concentration of substrate plugs 169 is placed in a region 350. This configuration of density of the substrate plugs 169 exemplifies the case that the substrate plugs 169 may be used to achieve a specific temperature profile on the substrate 139. For instance, the greater density of substrate plugs 169 in the region 340 may act to lower the operating temperature therein. In contrast, the lower density of substrate plugs 169 in the region 350 may act to increase the operating temperature therein. Configuring the placement of the substrate plugs 169 to produce a specific temperature profile during operation may be useful in situations in which performance of the device 100 is improved by such a temperature profile.

While various embodiments herein are described with reference to the connection of the heat spreader 160 to the IC 103, those skilled in the pertinent art will appreciate that the heat spreader 160 may be similarly connected to the IC 106. Furthermore, while FIG. 1 illustrates the two integrated circuits 103, 106 with the heat spreader 160 located therebetween, those skilled in the pertinent art will appreciate that a greater number of ICs may be stacked, with a heat spreader located between any two ICs as desired to laterally extract heat from the device stack. Each of these embodiments is explicitly included within the scope of the disclosure and the claims.

Turning to FIGS. 4A-4H, an example of a method generally designated 400 is described for forming a heat spreader, such as, e.g. the heat spreader 160. The method is described without limitation for the embodiment in which the thermally conductive core 163 is electrically conductive, but is not limited to such embodiments. The method is not exclusive of other methods that may be used to form the heat spreader 160. Those skilled in the pertinent art will appreciate that the method 400 is but one of various embodiments within the scope of the disclosure. For example, other embodiments may use different materials or different ordering of process steps without departing from the scope of the claims. Moreover, variations of the method necessary to accommodate an electrically insulating, but thermally conducting, core 163 are within the ability of those skilled in the pertinent arts.

Figure 4A:
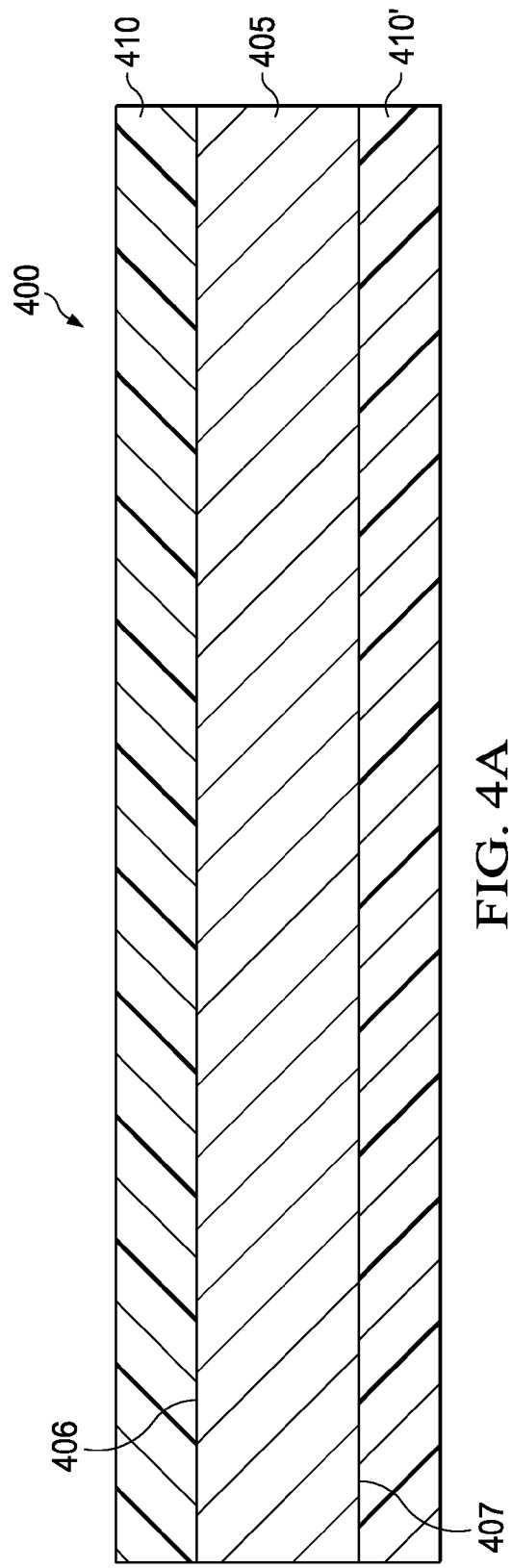

FIG. 4A illustrates a thermally conductive core 405, which may be, or include, any of the materials or material types described in the context of the thermally conductive core 163. A conventional photoresist layer 410 is located on an upper surface 406 of the thermally conductive core 405. A photoresist layer 410' is also illustrated optionally formed on a lower surface 407. The photoresist layer 410' may be formed for convenience, e.g., when the process used to coat the thermally conductive core 405 does not easily exclude coating the lower surface.

Figure 4B:
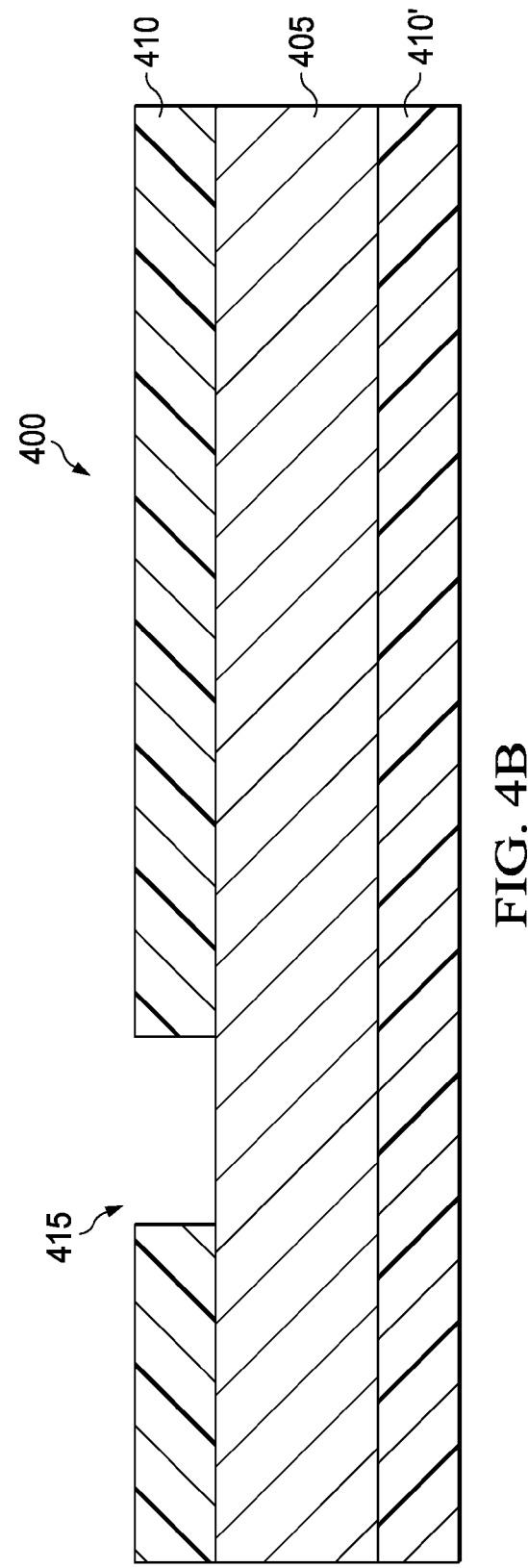

In FIG. 4B, an opening 415 is formed in the photoresist layer 410. In some cases it may be desirable to form a corresponding opening in the photoresist layer 410'. The opening 415 may be formed by any conventional method, such as masked exposure of the photoresist layer 410 to a light source, followed by development of the exposed portion thereof.

In FIG. 4C, a hole 420 is formed in the thermally conductive core 405. The hole 420 may be formed by, e.g. a wet or dry etch process. In an alternate embodiment of the method, the photoresist layer 410 may be omitted and the hole 420 formed by laser ablation or other method suitable to the diameter of the hole 420.

In FIG. 4D, a photoresist portion 425 has been formed. In some embodiments the photoresist layer 410 is patterned and developed a second time to form the photoresist portion 425. In other embodiments, the entire photoresist layer 410 is removed, and a second photoresist layer (not shown) is formed and patterned. In other embodiments, the photoresist portion 425 may be replaced by a conventionally formed and patterned dielectric portion, such as silicon oxide.

In FIG. 4E, a dielectric layer 430 has been formed on the thermally conductive core 405 and the photoresist portion 425. The dielectric layer 430 may be a conformally deposited material such as, e.g., parylene. Herein, the term "parylene" includes any material formed by surface polymerization of para-xylylene, including, e.g., parylene N, parylene C and parylene D. Parylene may advantageously form a high quality film with complete coverage of all exposed surfaces, including the interior walls of the hole 420. In some embodiments, the dielectric layer 430 includes an inorganic dielectric such as silicon oxide or silicon nitride. Those skilled in the pertinent art are familiar with processes for forming highly conformal layers of such materials.

FIG. 4F shows the heat spreader 160 after a heat spreader via 435 is formed within the hole 420. The heat spreader via 435 may include any suitable electrically conductive material, including a metallic plug, and any necessary liners or plating seed layers. Without limitation, the heat spreader via 435 comprises copper, and may be formed by electroplating or by a similar process such as electroless deposition. In some cases, a process of depositing one or more materials may result in a conductive film covering one or more surfaces of the dielectric layer 430. In such cases, the one or more layers may be removed by, e.g., a polishing step that leaves, as shown, a portion of the dielectric layer 430 remaining on the thermally conductive core 405, or optionally removes the dielectric layer 430 except from within the hole 420.

In FIG. 4G, the photoresist portion 425 has been removed, e.g., by solvent exposure and ultrasonic vibration and/or polish. The removal of the photoresist portion 425 also removes the dielectric layer 430 overlying the photoresist portion 425 to create an exposed portion 440 of the thermally conductive core 405. In some embodiments, a cleanup step, e.g. a short plasma ash, may be used to clean the newly exposed surface of the thermally conductive core 405. In such cases, the thickness of the dielectric layer 430 may be adjusted accordingly to compensate for loss during the ash. If a dielectric portion is used in place of the photoresist portion 425, the dielectric portion may be removed by a process selective to the dielectric layer 430, such as a polish and HF strip.

In FIG. 4H, a connection point 445 has been formed on the exposed portion 440. The connection point 445 may be any suitable combination of metallic and nonmetallic layers necessary to form a thermal and mechanical bond between the connection point 445 and the thermally conductive core 405. For example, when the thermally conductive core 405 is copper, the connection point 445 may include one or more of an organic surface protection layer, a Pd layer over a Ni barrier layer, and an Au layer to promote solder wetting to the connection point 445. In some cases, the connection point 445 may include a solder layer thereover, sometimes referred to as "tinned".

In embodiments in which the thermally conductive core 405 is an electrically nonconductive material such as BN or DLC, the connection point 445 may include a layer to interface a solderable metal pad to the thermally conductive core 405. In such embodiments, the metal pad may include an adhesion layer such as Ti or Al on the thermally conductive core 405. A barrier layer including such as Pt, Ni, and/or Pd may be located between a reactive/solderable layer such as, e.g. Au, Sn or a solder alloy. Those of skill in the pertinent art are familiar with methods of forming such layers, including sputtering, chemical vapor deposition, plasma deposition, atomic layer deposition, electrochemical deposition or electroless chemical deposition. Each layer may be deposited using a shadow mask or may be photolithographically defined using conventional processes.

FIG. 4H also includes a solder interface 450 located on the heat spreader via 435. The solder interface 450 may be the same combination of layers as is present in the connection point 445, but need not be. For example, in embodiments in which the thermally conductive core 405 is an electrically nonconductive material, and the heat spreader via 435 is copper, the solder interface 450 may be a combination of layers suitable for forming a solder joint with copper, while the connection point 445 may be a different combination of layers suitable for forming a solder joint with the electrically nonconductive material. Selective deposition and/or removal of material layers may be performed as necessary to form the desired material layer(s) on the heat spreader via 435 and the exposed portion 440.

Figure 4I:
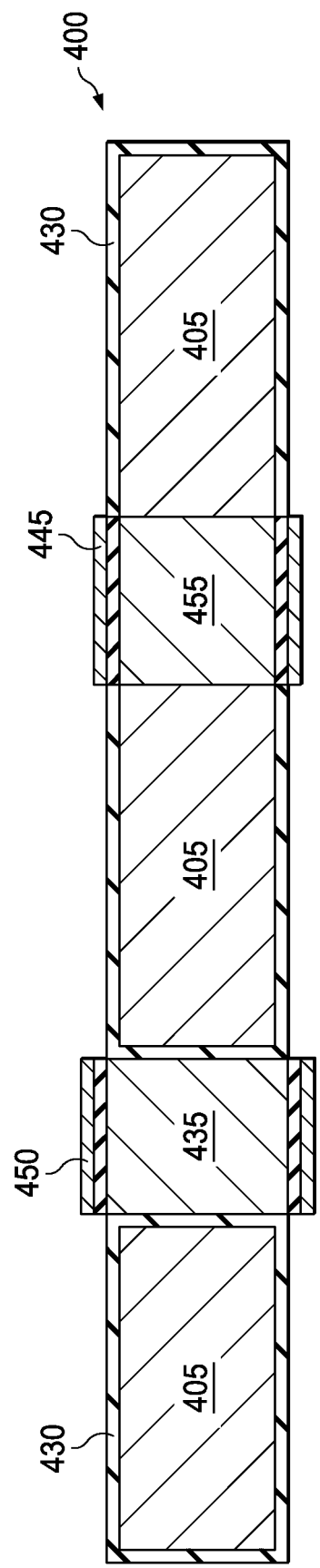

FIG. 4I illustrates an alternate embodiment in which a heat spreader plug 455 is formed within the thermally conductive core 405. The use of the heat spreader plug 455 may be particularly beneficial when the thermally conductive core 405 does not easily accept an interfacial layer on which to form the connection point 445. In some embodiments the heat spreader plug 455 is formed in the same manner as the heat spreader via 435. But in contrast to the heat spreader via 435, the heat spreader plug 455 need not be connected to an active via of an integrated circuit since the heat spreader plug 455 may be configured to conduct heat to the thermally conductive core 405. The heat spreader plug 455, if formed, may have a same or a different diameter as the heat spreader via 435.

Figure 5A:
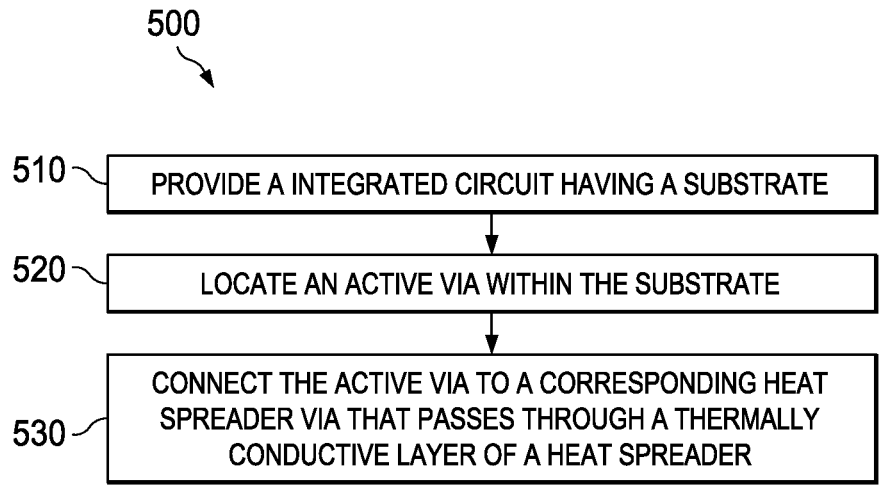
FIGS. 5A and 5B illustrate a method of forming an electronic device of the disclosure, e.g. the electronic device of FIG. 1.

Turning to FIG. 5A, a method of the disclosure generally designated 500 is presented for forming an electronic device, e.g. the device 100. The method begins with a step 510, in which an integrated circuit having a substrate, e.g., the substrate 139, is provided. Herein and in the claims, "provided" means that a device, substrate, structural element, etc., may be manufactured by the individual or business entity performing the disclosed methods, or obtained thereby from a source other than the individual or entity, including another individual or business entity.

In a step 520, an active via, e.g., the active via 151, is formed within the substrate. In a step 530, the active via is connected to a corresponding heat spreader via, e.g., the heat spreader via 220, that passes through a heat spreader comprising a thermally conductive layer, e.g., the thermally conductive core 163.

Figure 5B:
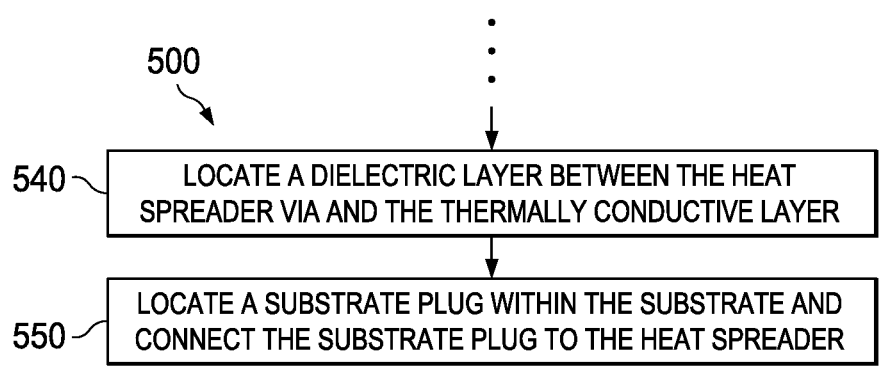

FIG. 5B presents optional steps of the method 500. In a step 540, a dielectric layer is located between the heat spreader via and the thermally conductive layer. The dielectric layer may be, e.g., the insulating sleeve 240 as described previously. In a step 550, a substrate plug, e.g. the substrate plug 169, is located within the substrate and connected to the heat spreader. The steps 540, 550, if performed at all, may be performed in an order different than that illustrated.

Those skilled in the art to which this application relates will appreciate that other and further additions, deletions, substitutions and modifications may be made to the described embodiments. The various embodiments described herein are for illustration, and the scope of the disclosure is not limited thereby. Those skilled in the pertinent arts will appreciate that the scope of the disclosure and the claims includes embodiments in which various aspects of the disclosed embodiments and principles have been augmented, adapted and/or reordered.

What is claimed is:

1. A heat spreader configured to be attached to an electronic device substrate, comprising:
    a thermally conductive core;
    a heat spreader via passing through said thermally conductive core; and
    a connection point of said thermally conductive core configured to form a solder connection to an integrated circuit substrate plug.

2. The heat spreader as recited in claim 1, wherein said thermally conductive core is an electrically conductive layer.

3. The heat spreader as recited in claim 2, further comprising a dielectric layer located between said thermally conductive core and said heat spreader via.

4. The heat spreader as recited in claim 2, further comprising a solder pad formed on a surface of said electrically conductive layer and configured to form a metallurgical connection to a solder ball.

5. The heat spreader as recited in claim 1, wherein said thermally conductive core is an electrically insulating layer.

6. The heat spreader as recited in claim 5, further comprising a heat spreader plug configured to form a metallurgical connection to a solder ball.

7. The heat spreader as recited in claim 1, where said thermally conductive core is in thermal contact with a device package configured to conduct heat therefrom.

\* \* \* \* \*